United States Patent [19]
Wilson et al.

[11] Patent Number: 5,166,643
[45] Date of Patent: Nov. 24, 1992

[54] REMOTELY CONTROLLED C BAND SIGNAL GENERATOR

[75] Inventors: Gordon K. Wilson, Ventura; Linda Ortiz-Gonzalez, Arleta; Sid G. Knox, Oxnard, all of Calif.

[73] Assignee: The United States of America as represented by the Secretary of the Navy, Washington, D.C.

[21] Appl. No.: 843,796

[22] Filed: Feb. 25, 1992

[51] Int. Cl.$^5$ .............................................. H03L 7/00
[52] U.S. Cl. .......................................... 331/2; 331/25; 342/165
[58] Field of Search ............... 331/2, 18, 23, 25, 34, 331/46, 175; 455/115; 342/165

[56] References Cited
U.S. PATENT DOCUMENTS

| | | | |
|---|---|---|---|
| 4,238,796 | 12/1980 | Mawhinney | 331/2 X |
| 4,969,819 | 11/1990 | James | 342/165 X |
| 5,053,722 | 10/1991 | Kuo et al. | 331/2 |

*Primary Examiner*—Robert J. Pascal
*Attorney, Agent, or Firm*—David S. Kalmbaugh; Melvin J. Sliwka

[57] ABSTRACT

A highly accurate remotely controlled C band signal generator which provides a microwave signal to a boresight tower for the purpose of calibrating a radar system. The C band signal generator comprises a data receiver circuit for receiving a serial digital data frame having a plurality of eight bit digital data words and for converting the words from serial to parallel. A pulse repetition generator circuit responsive to one of the eight bit digital data words provides a modulating signal having a first or second pulse repetition frequency. The modulating signal when supplied to a pin diode modulator amplitude modulates the microwave signal which is provided by a voltage tunable oscillator. An attenuation driver circuit responsive to a second of the eight bit words provides an analog signal to a first attenuator which attenuates the microwave signal by one decibel steps and also provides a digital signal to a second attenuator which attenuates the microwave signal by ten decibel steps thus providing for attenuation of the microwave signal within a range of zero to eighty-one decibels. In response to three of the eight bit words a pair of phase lock loop circuits provide a stable voltage control signal to the voltage control oscillator thus assuring frequency stability of the microwave signal provided by the C band signal generator.

17 Claims, 11 Drawing Sheets

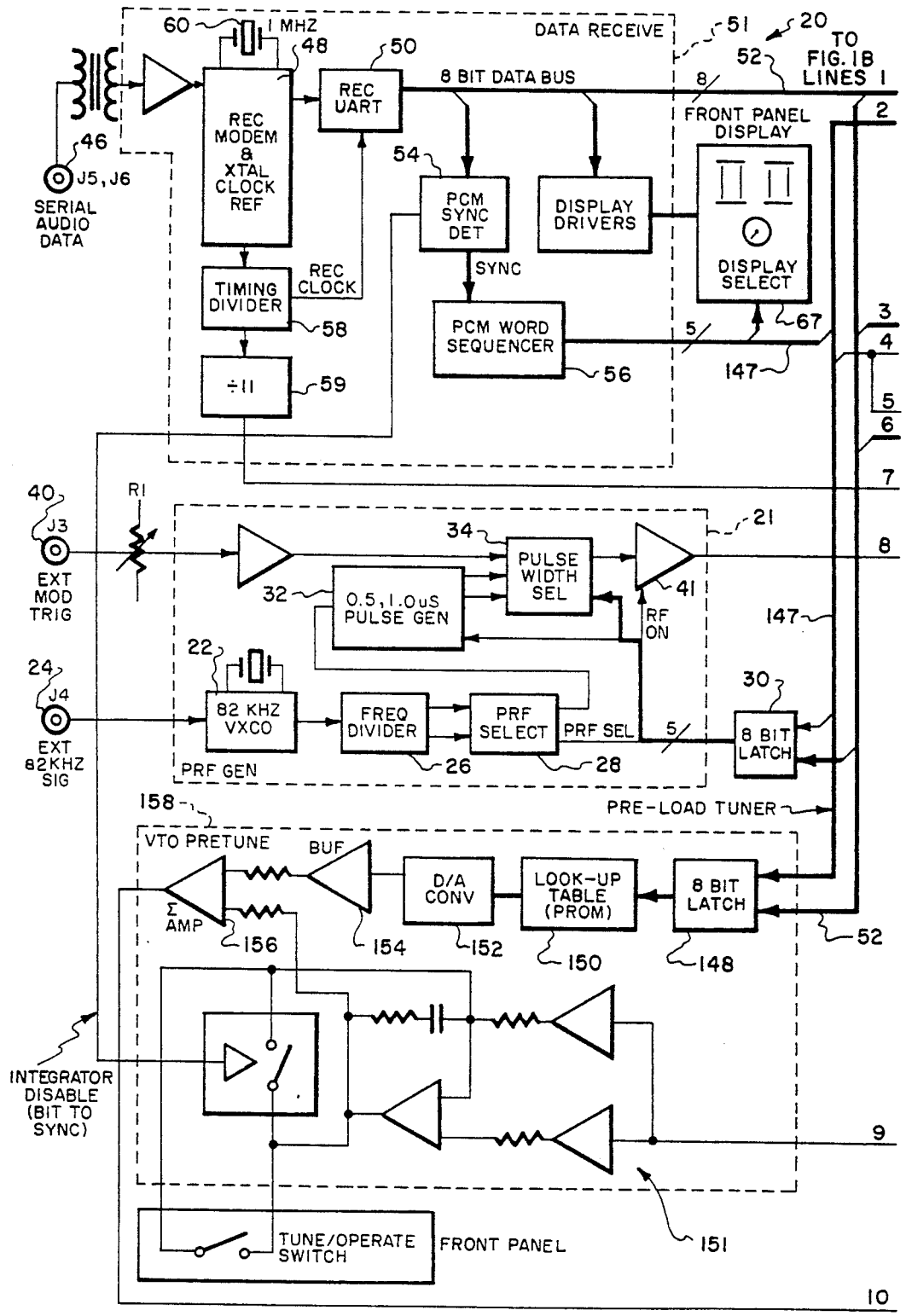

REMOTELY CONTROLLED C BAND SIGNAL GENERATOR

BACKGROUND OF THE INVENTION

1. Field of the Invention

This invention relates generally to radar systems and, in particular, to a C band signal generator which is used to calibrate radar.

2. Description of the Prior Art

It is important that the operational condition of a radar be calibrated frequently to insure that the radar system is functioning in a satisfactory manner. In the case of fixed position radar systems of which a high degree of accuracy is expected such as tracking radar or missile launch site radar, it is important to have a reliable means of calibrating the radar system so that the operator is assured of efficient operation of the radar system.

Heretofore, the operator would manually set a signal generator located at a remote site boresight tower. The signal generator is used with the boresight tower to calibrate the radar system. This prior art method of calibration required the operator to be physically present at the boresight tower and while at the boresight tower to adjust the attenuation, frequency and other radar functions required for calibration of the radar system while communicating with a second operator located at the radar console.

This prior art method of calibrating radar systems has proved to be unsatisfactory in that this method requires extensive periods of time and more than one operator to recalibrate the radar. In addition, frequently the boresight tower is in a remote location that makes access to the boresight tower difficult, further increasing the time and cumbersomeness of the task.

Accordingly, there is a need to provide an improved calibration apparatus for a radar system which will allow calibration of a radar system from the radar console without the presence of an operator at the remote site boresight tower.

SUMMARY OF THE INVENTION

The present invention overcomes the disadvantages of the prior art in that it comprises a relatively simple yet highly accurate remotely controlled C band signal generator which when connected to a boresight tower may be used to calibrate a radar system. The C band signal generator provides a microwave signal in the 5400–5900 MHz frequency range to the boresight tower to allow a radar system to be calibrated.

The C band signal generator comprises a data receiver circuit for receiving a serial digital data frame having a plurality of eight bit digital data words and for converting the words from serial to parallel. A pulse repetition generator circuit responsive to one of the eight bit digital data words provides a modulating signal which has a pulse repetition frequency of either 160 pulses per second or 640 pulses per second and a pulse width of either one microsecond or one half microsecond. The modulating signal when supplied to a pin diode modulator amplitude modulates a 5.4–5.9 Gigahertz microwave signal provided by a voltage tunable oscillator. An attenuation driver circuit responsive to a second of the eight bit words provides an analog signal to current controlled attenuator which attenuates the microwave signal by one decibel steps. The attenuation driver circuit responsive to the second of the eight bit words also provides a digital signal to a ten decibel step attenuator which attenuates the microwave signal by ten decibel steps thus providing for attenuation of the microwave signal from zero to eighty one decibels. In response to three of the eight bit words a pair of phase lock loop circuits provide a stable voltage control signal to the voltage control oscillator thus assuring frequency stability of the microwave signal provided by the C band signal generator.

It is an object of the present invention to provide an accurate, efficient and yet relatively simple apparatus which may be used to calibrate radar systems.

It is another object of the present invention to allow for the calibration of a radar unit with minimal operator participation.

It is yet another object of the present invention to calibrate a radar unit with minimal interference to normal radar operations.

These and other objects and many attendant advantages of the present invention will be readily appreciated as the same becomes better understood by reference to the following detailed description of the present invention when considered in conjunction with the accompanying drawings.

BRIEF DESCRIPTION OF THE DRAWINGS

FIGS. 1(A) and 1(B) is an electrical block diagram of the C band signal generator constituting the present invention;

DETAILED DESCRIPTION OF THE PREFERRED EMBODIMENT

Figure 1B:
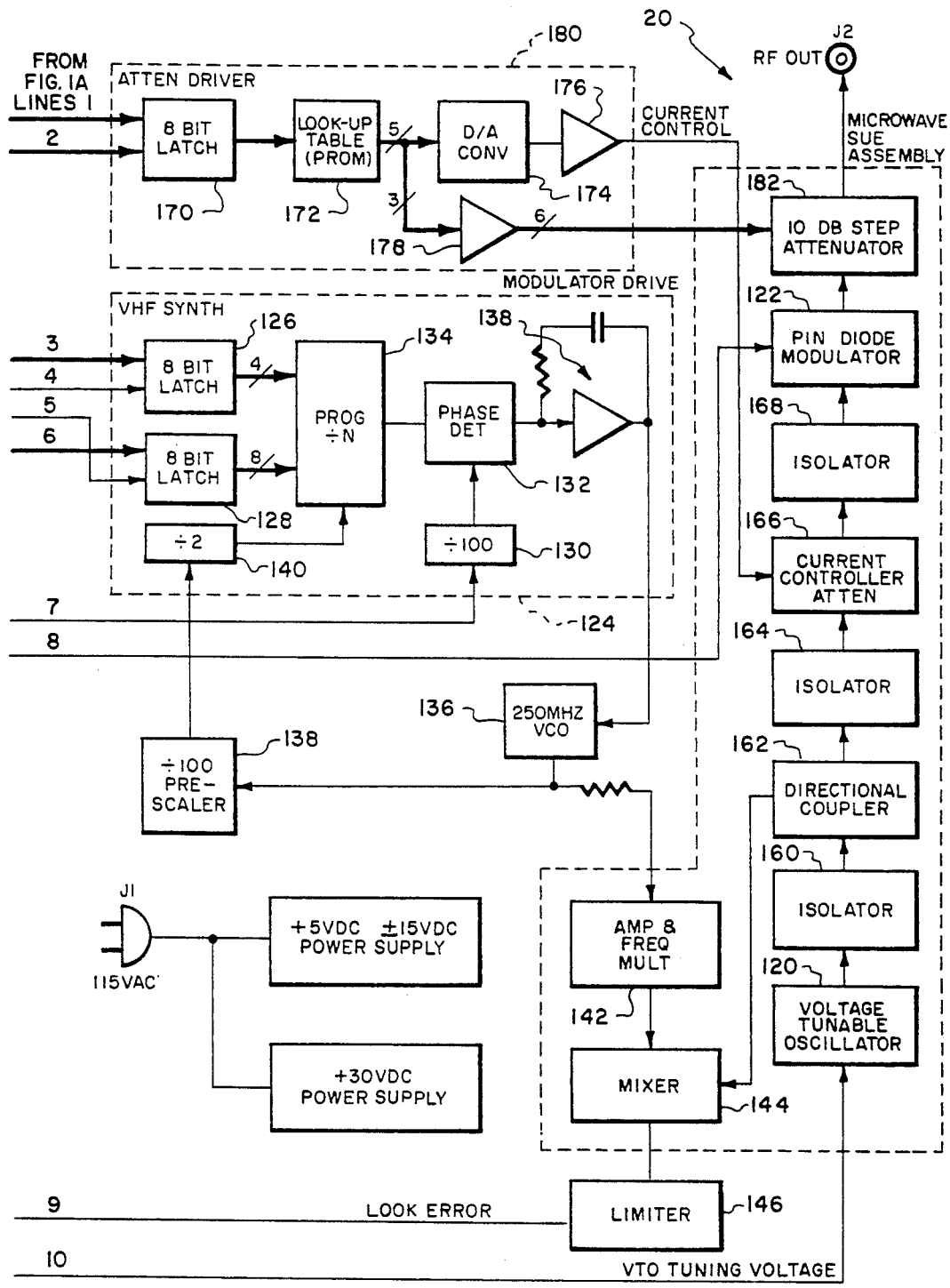

Referring first to FIG. 1 there is shown a C band signal generator 20 when electrically coupled to a boresight tower allows for the calibration of a radar unit. Signal generator 20 which provides a pulsed signal having a selectable pulse repetition frequency of either 160 pulses per second or 640 pulses per second and a selectable pulse width of 0.5 microseconds or 1.0 microseconds.

Pulse repetition frequency generator circuit 21 includes an 82 KHZ oscillator circuit 22 which may either be phased locked to an 82 KHZ reference signal supplied through an input terminal 24 or may operate independent of an external reference signal. The 82 KHZ signal generated by oscillator circuit 22 is supplied to a frequency divider 26 which provides a first signal having a pulse repetition rate or frequency of 640 pulses per second and a second signal having a pulse repetition frequency of 160 pulses per second. It should be noted that the frequency divider 26 used in the preferred embodiment of the present invention is a twelve stage binary ripple counter 73, FIG. 5(A).

The first and second signals provided by frequency divider 26 are supplied to a pulse repetition frequency select circuit 28. Pulse repetition frequency select circuit 28 determines whether the pulse repetition frequency will be 640 pulses per second or 160 pulses per second depending upon a one bit control signal provided to pulse repetition frequency select circuit 28 from the Q2 output of an eight bit latch 30 which functions as a status register. If a logic one is supplied to the PRF SEL input of circuit 28, circuit 28 provides at its output a signal having a pulse repetition frequency of 640 pulses per second. A logic zero to the PRF SEL input of circuit 28, results in circuit 28 providing at its output a signal having a pulse repetition frequency of 160 pulses per second.

The signal provided by pulse repetition frequency select circuit 28 is supplied to a pulse width generation circuit 32. Pulse width generation circuit 32 comprises a pair of one shot multivibrators 36 and 38, FIG. 5(A), with one shot multivibrator 36 being set to generate a pulse width of 1.0 microseconds and one shot multivibrator 38 being set generate a pulse width of 0.5 microseconds. Pulse width select circuit 34 then determines the pulse width of the pulsed signal generated by circuit 21 depending upon a second one bit control signal supplied from the Q1 output of eight bit latch 30. If a logic one is supplied to the PW SEL input of circuit 34, circuit 34 provides at its output a pulsed signal having a pulse width of 1.0 microsecond. A logic zero to the PW SEL input of circuit 34, results in circuit 34 providing at its output a pulsed signal having a pulse width of 0.5 microseconds.

Pulse repetition circuit 21 also includes an input terminal 40 through which an external modulation trigger signal may be provided to generate the 0.5 or 1.0 microsecond pulse. This external modulation trigger signal when used in conjunction with the external 82 KHZ signal provided through input terminal 24 allows an external timing system, not shown, to drive C band signal generator 20.

Figures 8, 9A:
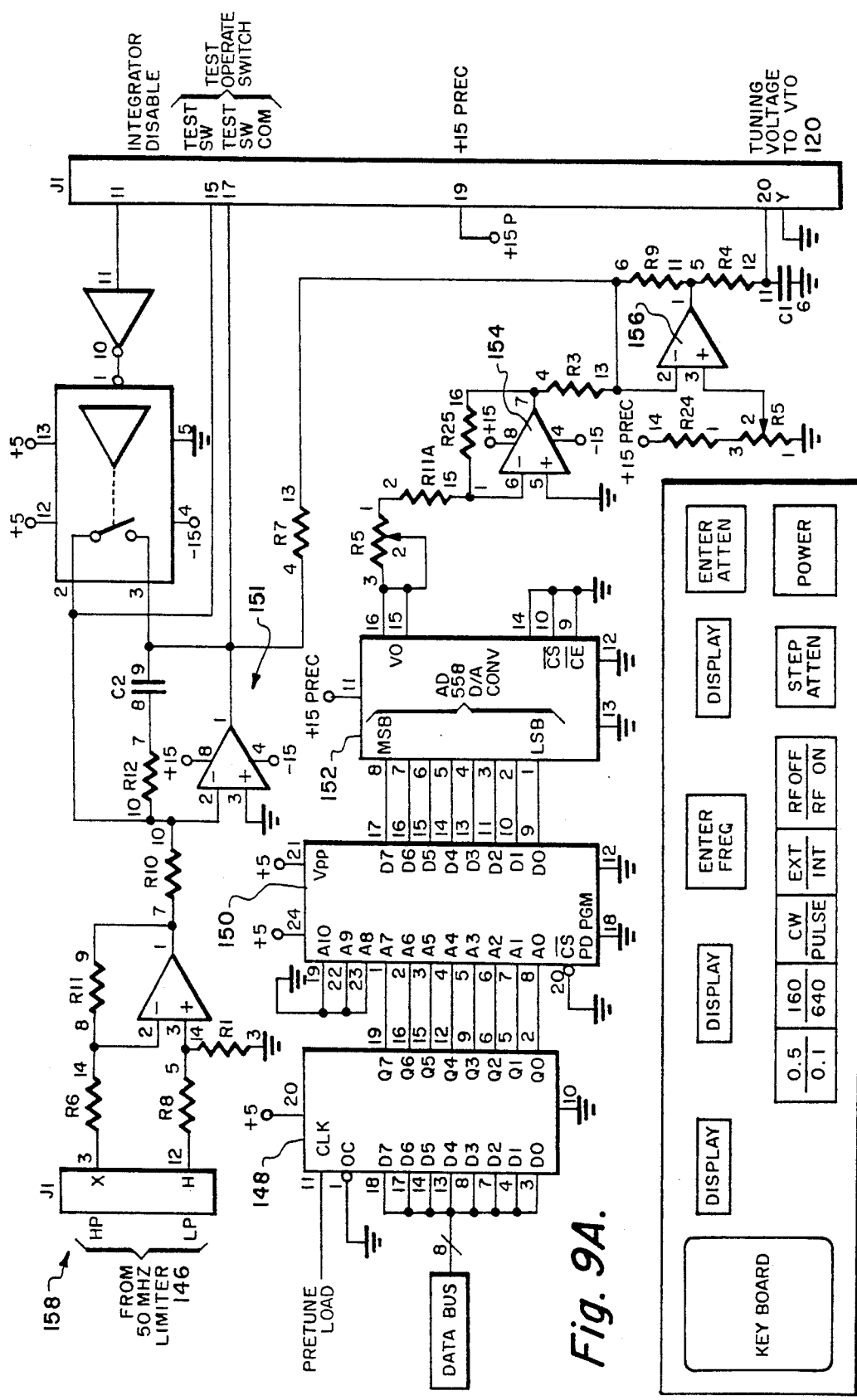
FIG. 8 is a front view of the control panel which generates each data frame of FIG. 3.
FIGS. 9(A) and 9(B) are a detailed electrical schematic of the VTO pretune and attenuation driver circuits of the present invention.
Figure 9B:
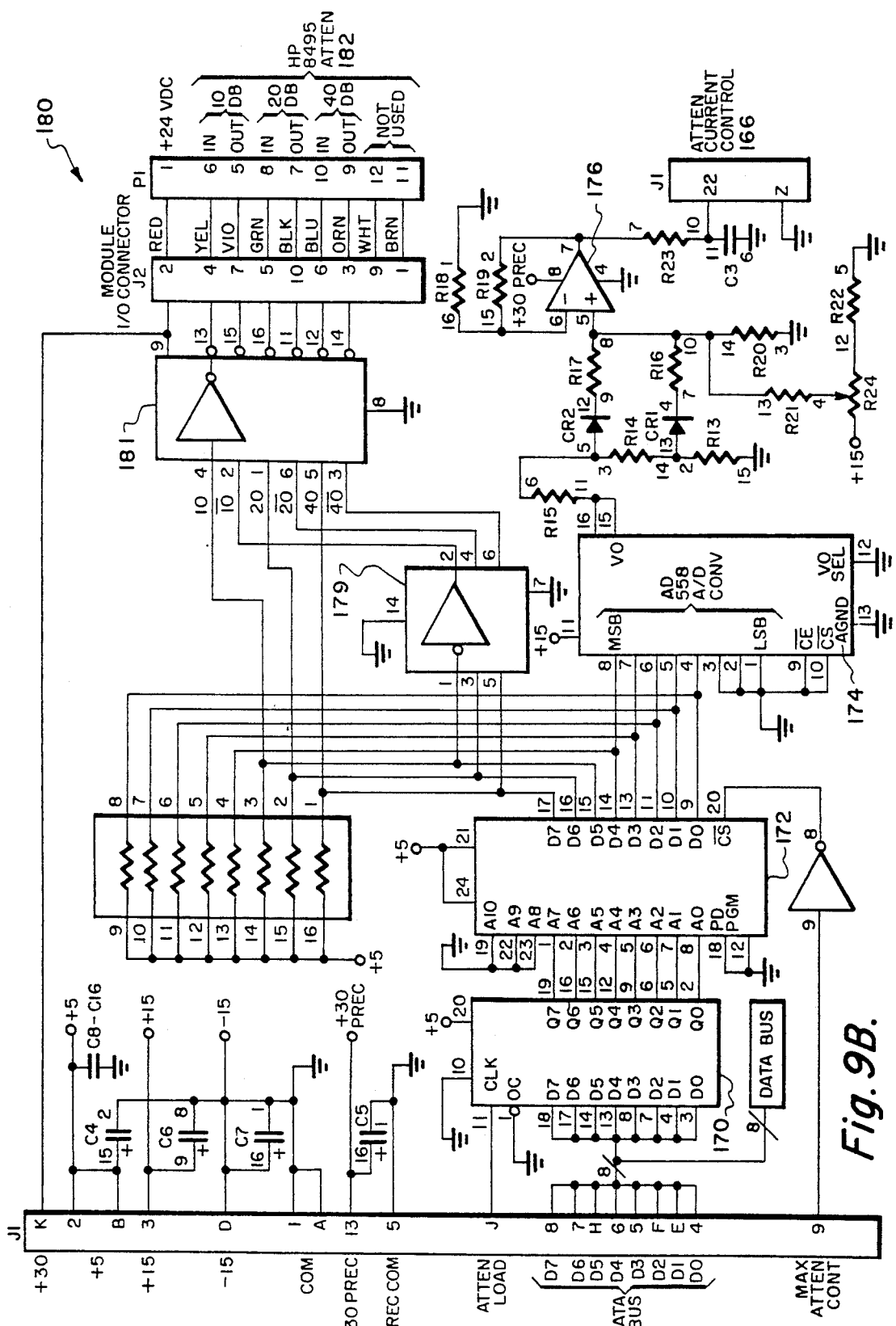

An eight bit data word which includes the control bits for pulse repetition frequency generator circuit 21 is provided to latch 30 from an external control panel 43, FIG. 8, through a serial data telephone line, not shown, and input terminal 46 to a receiver modem 48 which demodulates the data word, that is converts the data from audio signals to logic signals. It should be noted that control panel 43 is used by an operator to enter the frequency and attenuation data required to generate each data frame of FIG. 3. For example, if the modulating signal generated by pulse repetition frequency generating circuit 21 is to have a pulse repetition frequency of 640 pulses per second and pulse width of one microsecond, the operator will press the 1.0, 640, PULSE, INT and RF ON switches on panel 43. It should be understood that other well known and conventional means such as a computer may be used by an operator to generate the serial data frame of FIG. 3.

Receiver modem 48 then supplies the eight bit data word to a universal asynchronous receiver transmitter 50 which converts the word from serial to parallel for transmission via data bus 52 to latch 30 for loading into latch 30. It should be noted the modem 48 used in the preferred embodiment of the present invention is a Motorola Model MC4412 universal low speed modem and the universal asynchronous receiver transmitter 50 is an Intersil Model 6402 universal asynchronous receiver transmitter.

Figure 2A:
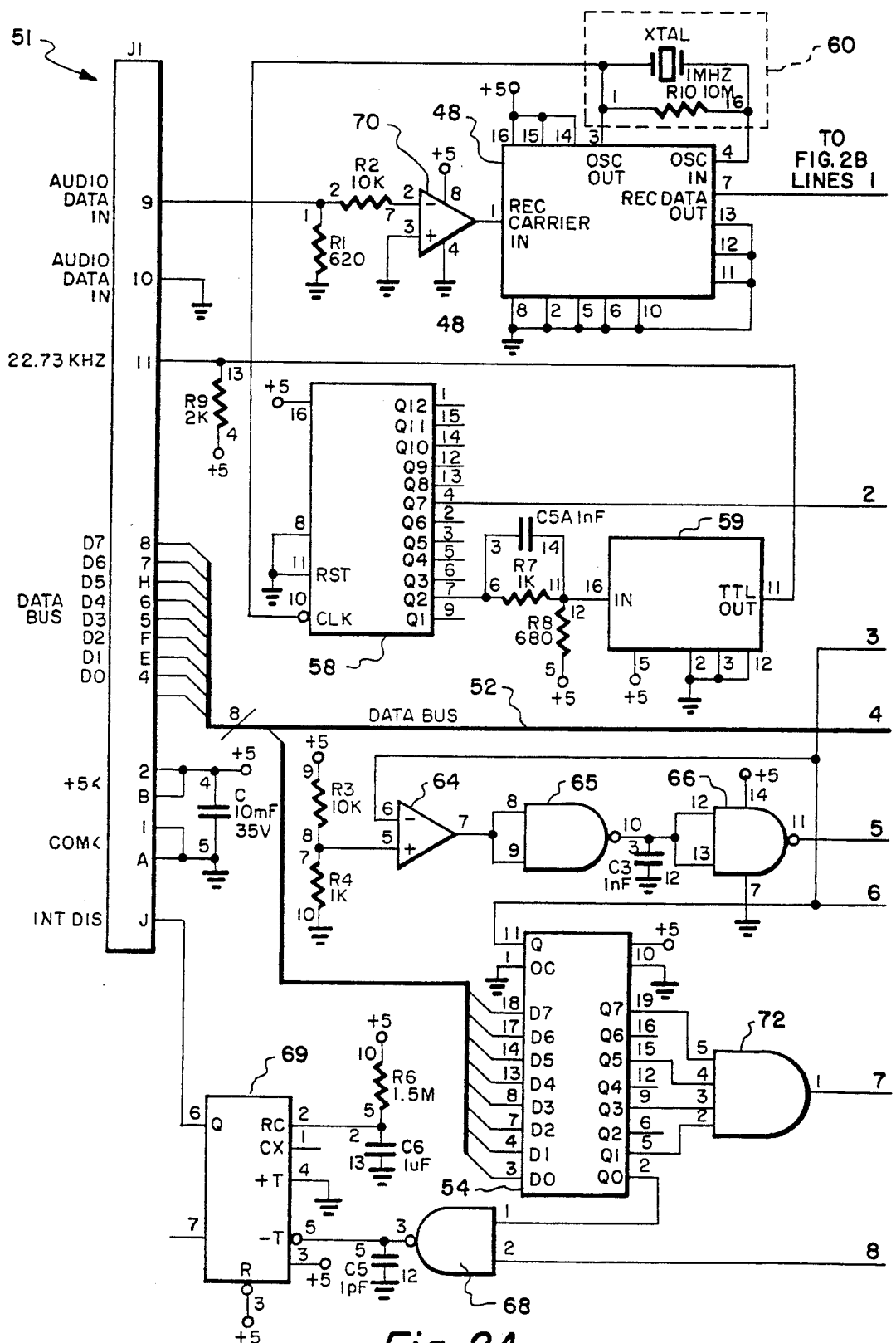
FIGS. 2(A) and 2(B) is a detailed electrical schematic illustrating the data receiver circuit of the present invention.
Figure 2B:
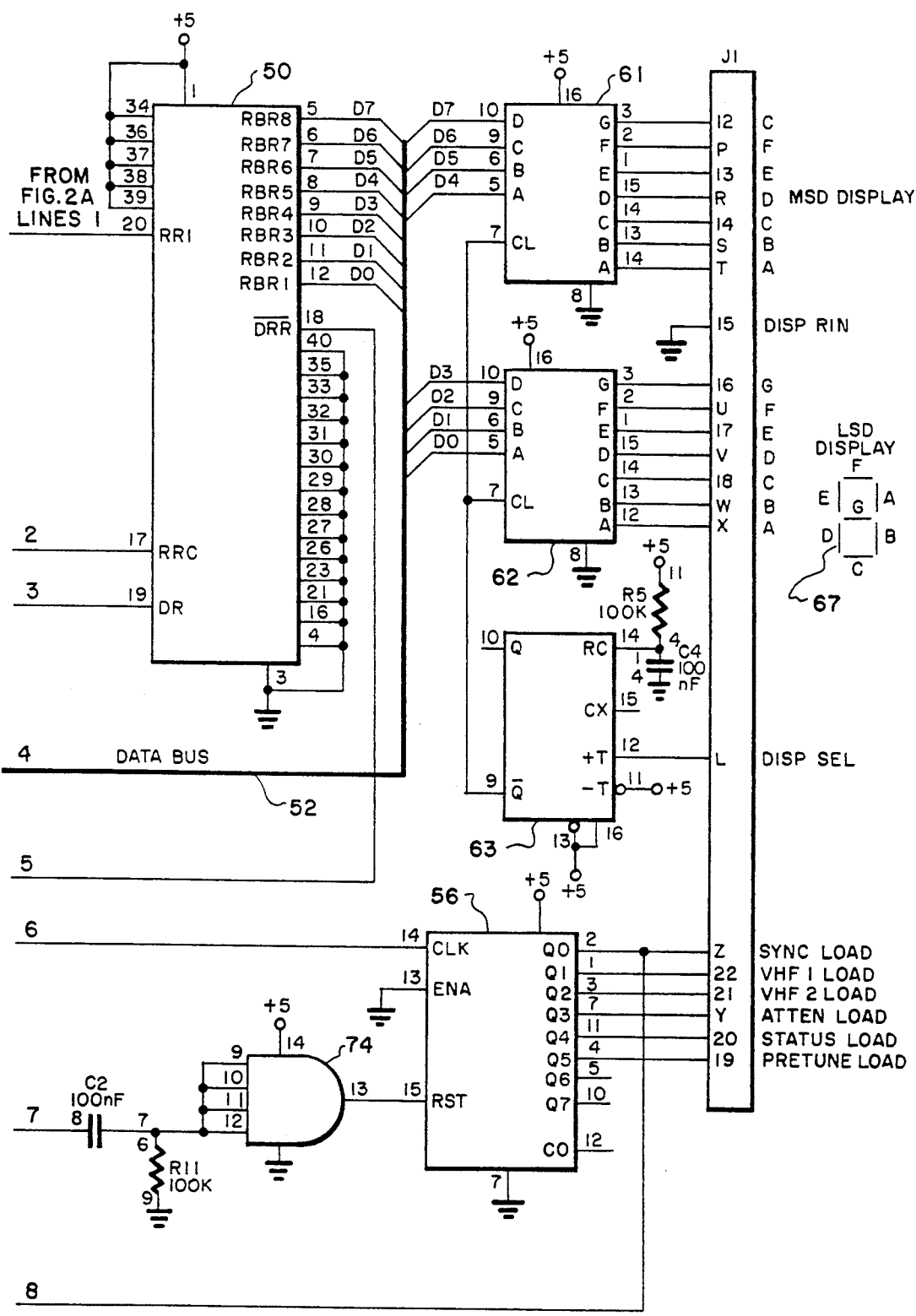
Figures 3A, 3B, 3C:
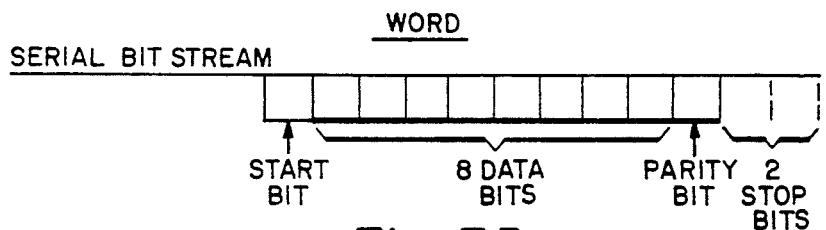
FIGS. 3(A)–3(C) illustrates the format of each frame of serial data provided to the data receiver circuit of present invention.

Referring to FIGS. 2 and 3 the data provided to data receiver circuit 51 is provided in FIGS. 3(A) and 3(B). In the preferred embodiment of the present invention each data word includes a start bit, eight data bits, a parity bit and two stop bits, that is there are twelve bits per word. There are eight words per frame and five frames per second are transmitted to the data receiver circuit 51 for a transmission rate via telephone line 44 of 480 bits per second. FIG. 3(A) illustrates the eight data words transmitted serially via telephone line 44 through operational amplifier and modem 48 to the RRI input of universal asynchronous receiver transmitter 50. Transmitter 50 first converts the sync data word of each frame of data from serial to parallel and then supplies the sync word to the D0–D7 sync detector 54. A clock pulse is then provided by transmitter 50 to a pulse code modulated sync detector 54 which latches the sync word into detector 54. Since the sync word has the bit pattern illustrated in FIG. 2, logic ones will be supplied from the Q1, Q3, Q5 and Q7 outputs of detector 54 to the inputs of AND gate 72 resulting in a sync detector pulse at the output of AND gate 72. This sync detector pulse is fed through AND gate 74 to the RST input of a pulse code modulated word sequencer 56 resetting sequencer 56. For each word of the data frame of FIG. 3(A), transmitter 50 provides a clock pulse to the CLK input of sequencer 56 which sequentially steps the Q0 through Q7 outputs of sequencer 56 to a logic one state. Thus, for example, when transmitter 50 provides the status word to data bus 52 for loading into latch 30, transmitter 50 will also provide a clock pulse to the CLK input of sequencer 56 which results in a status load pulse being provided at Q4 output of sequencer 56 and then being supplied to CLK input of latch 30. The status load pulse, in turn, results in the eight bit status word being loaded into latch 30. Latch 30 provides five control bits to pulse repetition frequency generator circuit 21.

Figure 4:
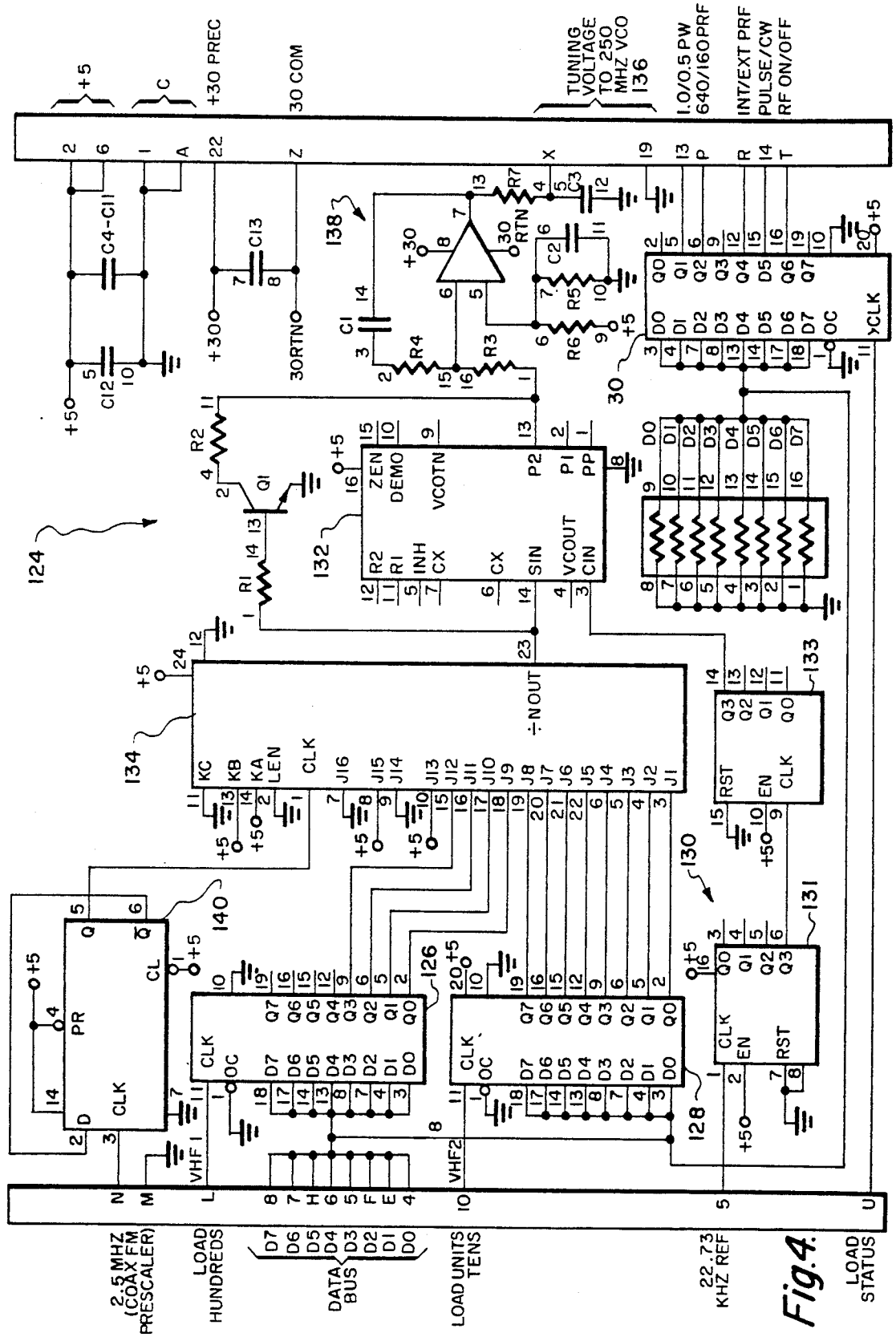
FIG. 4 is a detailed electrical schematic of the VHF synthesizer circuit and status register of the present invention.

Referring to FIGS. 1, 2(A) and 4, data receiver circuit 51 further comprises a timing divider circuit 58 which receives at its CLK input a one megahertz clock signal from an oscillator 60. Timing divider circuit 58, in turn, provides at its Q7 output a 7812 hertz clock signal which is supplied to the RRC input of universal asynchronous receiver transmitter 50 allowing transmitter 50 to sequentially convert each of the data words of the data frame of FIG. 3(A) from serial to parallel for transmission of each data word via bus 52 to the appropriate latch. Timing divider circuit 58 also provides at its Q2 output a 250 kilohertz clock signal which is supplied to the input of a divide by eleven circuit 59 which provides at its output a 22.73 kilohertz reference signal.

Figure 5A:
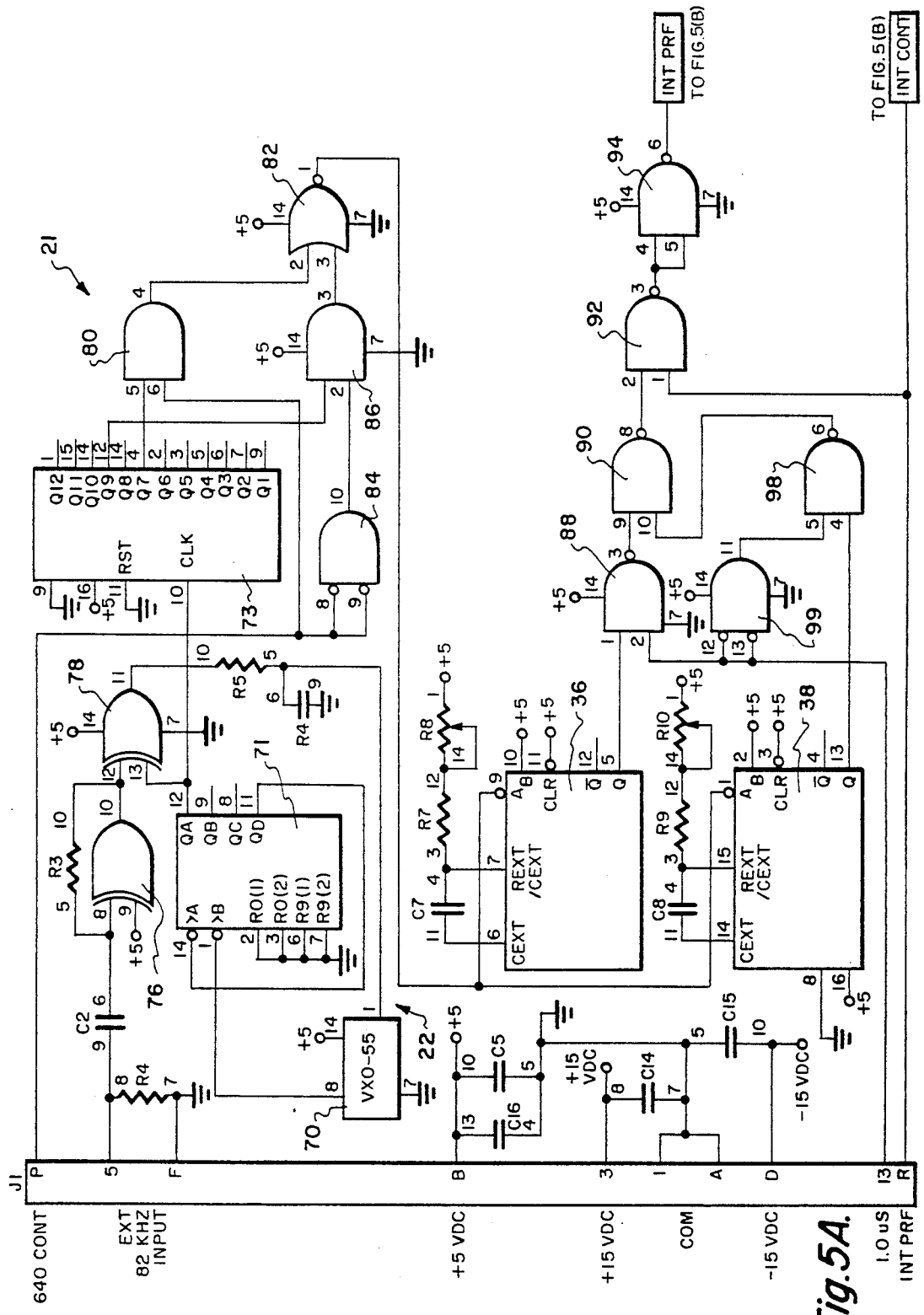
FIGS. 5(A) and 5(B) is a detailed electrical schematic of the pulse repetition generator circuit and the pin diode modulator of the present invention.

Referring to FIG. 5(A), oscillator circuit 22 which includes oscillator 70 and a divide by ten circuit 71 may provide at the output of circuit 71 an internally generated 82 kilohertz clock signal which is supplied the CLK input of a timing divider circuit 73. Alternatively, the 82 kilohertz clock signal generated by oscillator 22 may phase locked by a pair of EXCLUSIVE OR circuits 76 and 78 to the 82 kilohertz external reference signal supplied to terminal 24.

Timing divider circuit 73 provides at its Q7 output a 640 pulses per second signal and at its Q9 output a 160 pulses second signal. When the Q2 output of latch 30 is at the logic one state the 640 pulses per second signal will pass through AND gate 80 and NOR gate 82 to the A inputs of multivibrators 36 and 38. Multivibrator 36 then generates a 640 pulses per second signal with each pulse of the 640 pulses per second signal having a pulse width of 1.0 microseconds, while multivibrator 38 then generates a 640 pulses per second signal with each pulse of the 640 pulses per second signal having a pulse width of 1.0 microseconds.

When the Q1 and Q4 outputs of latch 30 are the logic one state indicating that the pulse width is 1.0 microsecond and the pulse repetition frequency is internally generated by C band signal generator 20 the 640 pulses per second signal generated by multivibrator 36 will pass through NAND gate 88, NAND gate 90, NAND gate 92 and NAND gate 94 to the first input of NOR gate 96. Similarly, when the Q1 output of latch is at the logic zero state and the Q4 output of latch 30 is at the logic one state indicating that the pulse width is 0.5 microseconds and the pulse repetition frequency is internally generated by C band signal generator 20 the 640 pulses per second signal generated by multivibrator 36 will pass through NAND gate 98, NAND gate 90, NAND gate 92 and NAND gate 94 to the first input of NOR gate 96.

Referring to FIGS. 1, 2(B) and 4 when the Q5 and Q6 outputs of latch 30 are at the logic zero state, indicating that a continuous wave signal is to be provided by C band signal generator 20 a pulsed signal is inhibited from passing through NAND gate 100 and AND gate 106, that is the output of NAND gate 100 will always be at the logic one state and the output of AND gate 106 will always be at the logic zero state.

When the Q5 and Q6 outputs of latch 30 are at the logic one state, pulse repetition frequency generator circuit 21 provides either a 640 pulses per second signal or a 160 pulses per second signal (depending upon the logic state of the Q1 output of latch 30) with each signal functioning as a modulating signal for the continuous wave/microwave signal generated by 5.4–5.9 MHZ voltage tunable oscillator 120. The modulating signal provided by pulse repetition frequency generator circuit 21 when applied to a pin diode modulator 122 amplitude modulates the microwave signal provided by oscillator 120.

Figure 6:
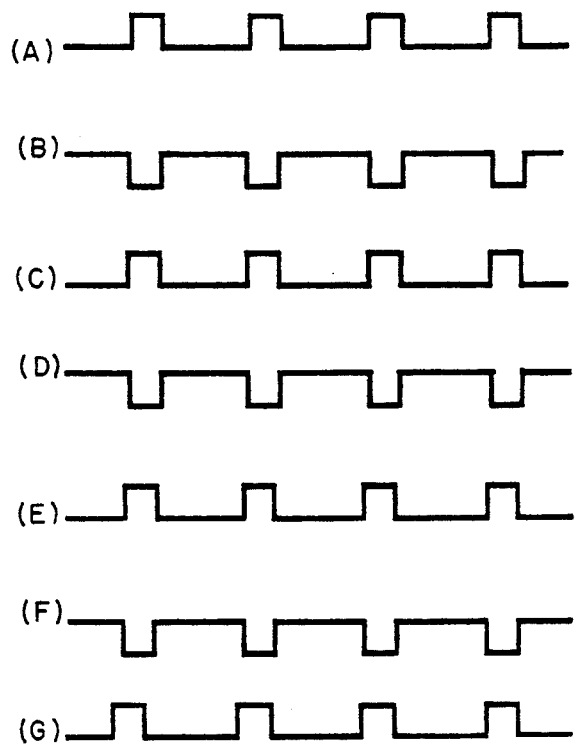
FIG. 6 illustrates various pulsed signals generated by the logic elements of the PRF generator of the present invention.

Specifically, a logic one supplied from the Q5 output of latch 30 to the first input of NAND gate 100 allowing the pulsed signal, FIG. 5(A), (either 640 pulses per second or 160 pulses per second) from NAND gate 94 to pass through NOR gate 96, FIG. 6(B), NAND gate 100, FIG. 6(C), and inverter 102, FIG. 6(D) to the first input of a NOR 103. The pulsed signal which is inverted by NOR gate 96, FIG. 6(D), is supplied to the cathode of a diode 105. When the pulsed signal from NOR gate 96 is at the logic zero state (either 0.5 or 1.0 microseconds) capacitor C9 discharges from five volts to zero volts which results in the output of inverter 104 going from a logic zero state to a logic one. When the pulse signal from NOR gate 96 transitions to the logic one state capacitor C9 will charge to five volts which results in the output of inverter 104 returning to the logic zero state resulting in the pulsed signal of FIG. 6(E). The signal of FIG. 6(E) is inverted resulting in the signal of FIG. 6(F) which is supplied to the second input of NOR gate 103. This results in the pulsed signal of FIG. 6(G) at the output of NOR gate 103 which is the pulsed signal supplied through a driver circuit 110 to pin diode modulator 122. Pin diode modulator 122 in response to the modulating signal provided by circuit 21 amplitude modulates the microwave signal generated by oscillator 120.

At this time it should be noted that it is well known to employ Pin diode modulators for modulating the of microwave signals. One of the advantages of Pin diodes in such applications is that those devices, when forward biased, provide resistance which varies inversely with diode current and, accordingly, provide a voltage current relationship which is exponential. Another advantage of Pin diodes in microwave modulating applications is that the diodes have generally monotonic frequency response characteristics in the microwave frequency range.

Referring again to FIG. 2, when transmitter 50 generates a clock pulse at its DR (Data Received) output, the output of operational amplifier 64 goes to a logic zero state resulting in a logic one at the output of NAND gate 65 and a logic zero at the output of NAND gate 66 which is supplied to the /DRR (Not Data Received Reset) input of transmitter 50 clearing transmitter 50 for the next data word to be provided to the RBR1–RBR7 outputs of transmitter 50. It is desired by an operator to display the data word currently on the data bus 52, a switch, not shown, when activated by the operator will result in a logic zero to one transition being supplied to the +T input of flip-flop 63. This, in turn, will result in a clock pulse being provided to the CL inputs of a pair of drivers 61 and 62 for display by a seven segment display 67 or the like.

Referring now to FIGS. 1, 2, 3 and 4, there is shown a digital high frequency synthesizer 124 which uses a phase lock loop system for generating a VHF signal which is defined by the second and third words of the data frame of FIG. 3(A). When universal asynchronous receiver transmitter 50 receives and then provides to data bus 52 the second data word of the data frame of FIG. 3(A), transmitter 50 will also supply to a clock pulse to the CLK input of word sequencer 56. In response to this clock pulse word sequencer 56 provides a VHF 1 load pulse which when supplied to the CLK input of an eight bit latch 126 loads the second data word of FIG. 3(A) into latch 126. In a like manner the third data word of the data frame of FIG. 3(A) is loaded into an eight bit latch 128.

C band signal generator 20 operates within a frequency range of 5400–5900 MHz. The one megahertz clock signal generated by oscillator 60 is used by C band signal generator 20 as a stable reference signal for the operation of generator 20. The one megahertz clock signal is supplied to timing divider circuit 58 which provides at its Q2 output a 250 kilohertz clock signal. The 250 kilohertz clock signal is supplied to the input of a divide by eleven circuit 59 which provides at its output a 22.73 kilohertz reference signal.

The 22.73 kilohertz reference signal provided by divide by eleven circuit 59 is supplied to a divide by one hundred circuit 130 which generates a 227 HZ reference signal supplied to a phase detector 132. This 227 HZ signal is the stable reference signal required for the operation of VHF synthesizer circuit 124. It should be noted that the divide by one hundred 130 comprises a pair of divide by ten circuits 131 and 133 configured in series to divide the 22.73 reference signal by a factor of one hundred and thereby generate the 227 Hz reference signal supplied to phase detector 132.

Figure 5B:
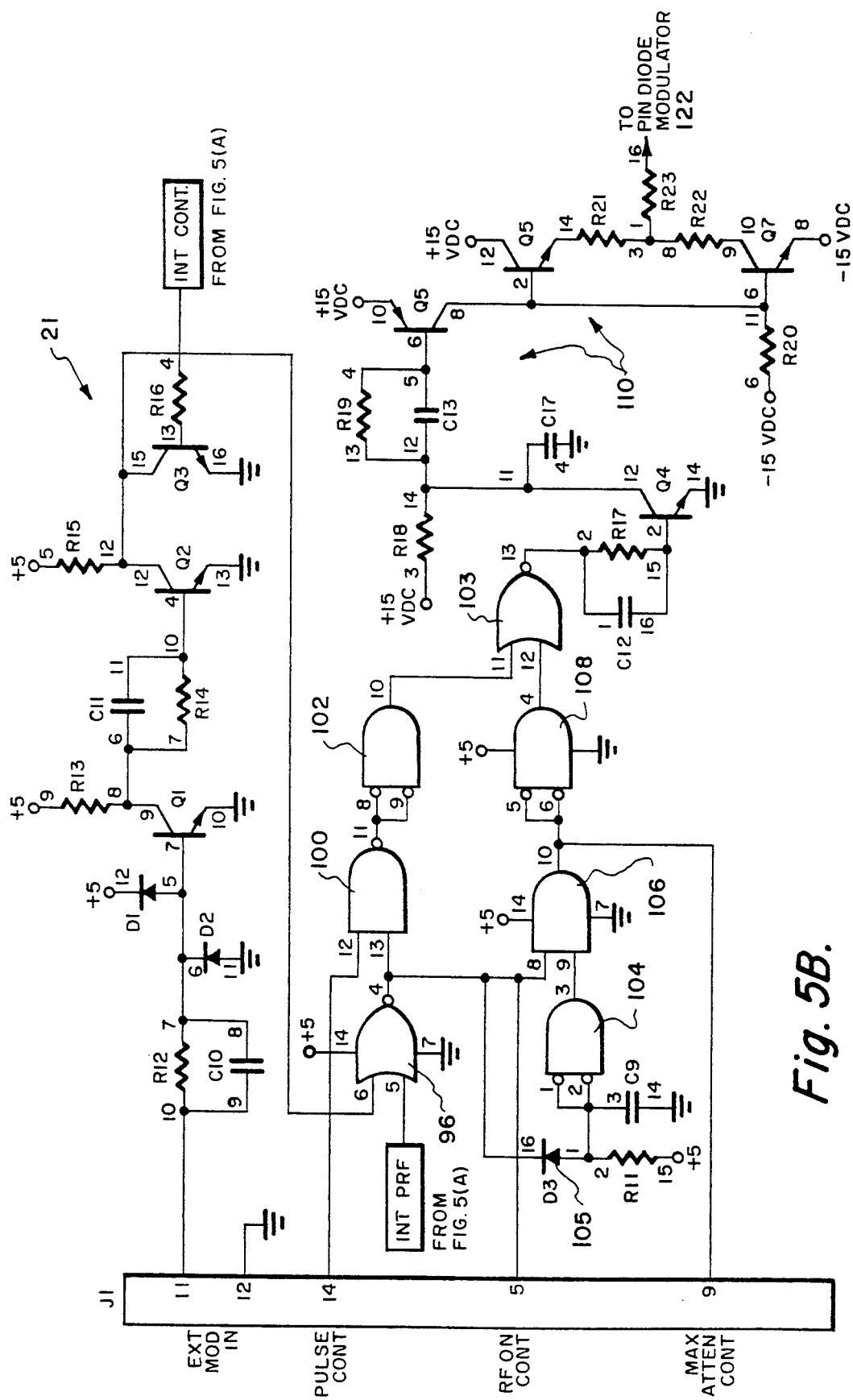

Referring to FIGS. 1 and 5 VHF synthesizer circuit 124 comprises a programmable divide by N counter 134 which is used with a voltage controlled oscillator 136 as part of a phased locked loop to select a stable frequency within a range of approximately 245-268 MHz. The frequency provided by the voltage controlled oscillator may be approximated by the following expression:

$$f_{VCO} = Nf_{REF} \tag{1}$$

where $f_{vco}$ is the frequency provided by oscillator 136, $f_{REF}$ is the 227 Hz stable reference signal and N is the binary coded number supplied by eight bit latches 126 and 128 to counter 134 and which determines the number of controlled output frequencies obtainable from oscillator 136. Each of the output frequencies generated by counter 134 when phased locked will be phase coherent with the 227 Hz reference signal and thus stable.

Phase detector 132 functions as a differential comparator or an error sensing circuit. Phase detector 132 provides at its P2 output an output voltage which is supplied to oscillator 136 through a low pass filter 138 and is the resultant of the phase difference of the signals supplied to the SIN and CIN inputs of phase detector 132. The signal provided by phase detector 132 is amplified by low pass filter 138 for the purpose of increasing the voltage controlled oscillator tuning voltage range and for suppressing any reference ripple which can frequency modulate oscillator 136.

For the VHF synthesizer 124 of the present invention it was also found to be desirable to reduce the high speed clock requirements of programmable divide by N counter 134. To achieve this the output of voltage controlled oscillator 136 is fed to a divide by one hundred pre-scaler circuit 138 dividing the 235-300 MHz signal to a range of 2.35-3.00 MHz and then supplying this signal to a divide by two circuit 140 resulting in a signal of approximately 1.25 megahertz (1.125-1.5 MHz) for clocking counter 134. It should be noted that divide by two circuit is a D type Flip-Flop.

At this time it should be noted that the VHF synthesizer 124 of C band generator 20 provides excellent frequency stability in the operating of 5400-5900 MHz. In addition, it should be noted that phase detector 134 is a Model 4046A high speed CMOS logic Phase-Locked-Loop with VCO and that counter 134 is a Model 4059 high speed CMOS logic Programmable Divide-by-"N" Counter each manufactured by RCA Corporation.

Figure 7:
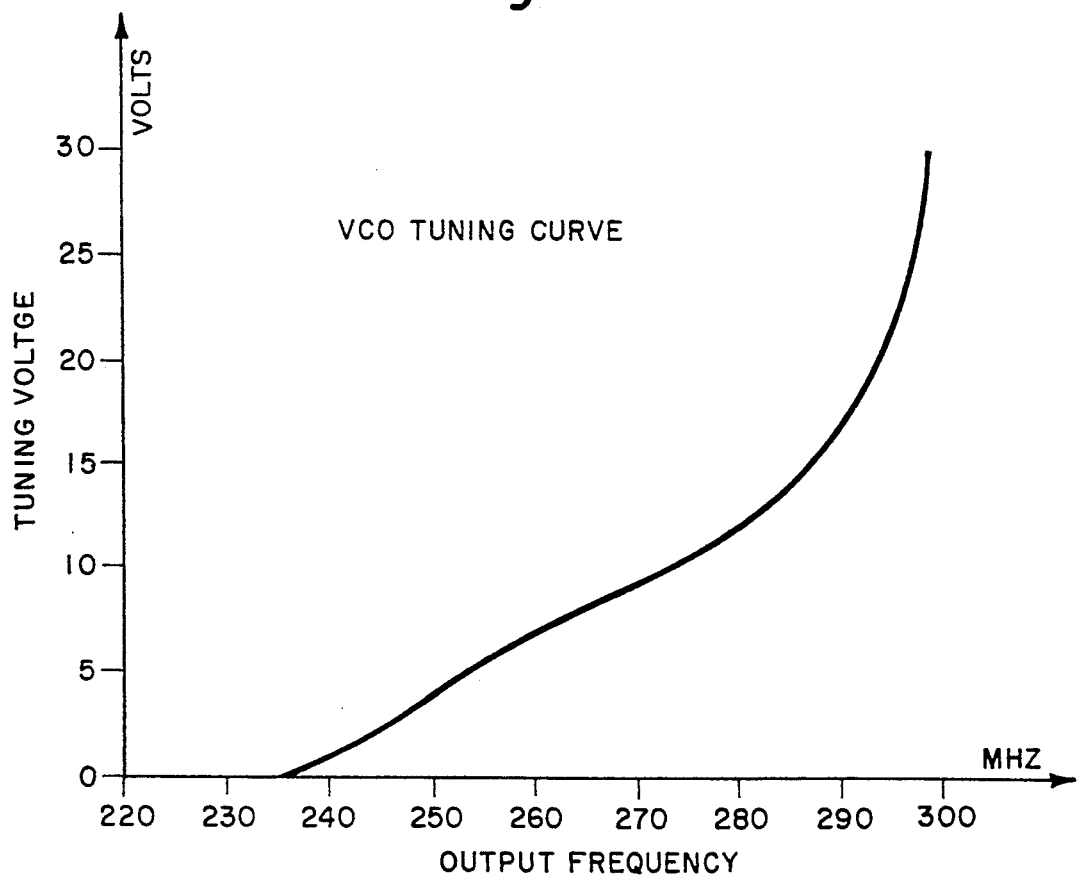
FIG. 7 is a graph illustrating the frequency of the signal provided by the voltage controlled oscillator of the present invention as a function of the input voltage to the oscillator.

Referring to FIGS. 1 and 7, the signal generated by voltage controlled oscillator 136 is supplied to an amplitude and frequency multiplier 142 which multiplies the signal by a factor of twenty two to achieve a frequency in the range of 5400-5899 MHz.

Referring to FIGS. 1, 2 and 3 voltage tunable oscillator pretune circuit 158 functions as a phase lock loop circuit which samples and then locks the microwave signal generated by voltage tunable oscillator 120 to a reference signal provided by a programmable read only memory 150. When universal asynchronous receiver transmitter 50 receives and then provides to data bus 52 the sixth data word of the data frame of FIG. 3(A), transmitter 50 will also supply to a clock pulse to the CLK input of word sequencer 56. In response to this clock pulse word sequencer 56 provides a Pretune Load pulse which when supplied via a five bit data line 147 to an eight bit latch 148 loads the second data word of FIG. 3(A) into latch 148. The eight bit data stored in latch 148 is supplied to programmable read only memory 150 and provides addressing for a look-up table stored in memory 150. Appendix A is a listing of the contents of the look-up table stored within memory 150. This look-up table provides an eight bit hexadecimal coded digital frequency response for each eight bit address supplied to memory 150 within the frequency range of 5400-5899 MHz.

The eight bit hexadecimal coded digital frequency signal is fed to a digital to analog converter 152 which converts the eight bit hexadecimal coded digital frequency to an analog reference signal representative of the frequency selected from the look-up table of Appendix A and then supplies the analog signal through a buffer amplifier 154 to a summing amplifier 156. Simultaneously, the microwave signal generated by voltage tunable oscillator 120 is supplied to an isolator 160, which passes the microwave signal in one direction only from isolator 160 to a directional coupler 162. Directional coupler 162 samples the microwave signal generated by oscillator and feeds the sampled signal to mixer 144. Mixer 144 provides at its output an error signal which is the difference between the sampled signal from coupler 162 and the signal provided by voltage controlled oscillator 136. This error signal is then fed through limiter/discriminator 146 which provides an approximately 50 MHz offset and through an amplifier/driver circuit designated generally as 151 and to summing amplifier 150. In response to the eight bit hexadecimal coded digital frequency signal provided by memory 148 and the error signal from mixer 144, summing amplifier 150 generates a direct current voltage to drive voltage tunable oscillator 120 which is tuned to the analog reference signal from converter 152 and thus is very stable. It should be noted that limiter/discriminator 146 will always maintain a minimum of a 50 megahertz error signal.

The microwave signal generated by voltage tunable oscillator 120 when at the required frequency as set forth in the look-up table of Appendix A is fed through isolator 160, coupler 162 and isolator 164 to current controlled attenuator 166.

Referring now to FIGS. 1, 2, 3 and 9, there is shown an attenuation driver circuit 180 which provides an analog signal and a digital signal for attenuating the microwave signal generated by oscillator 120. When universal asynchronous receiver transmitter 50 receives and then provides to data bus 52 the fourth data word of the data frame of FIG. 3(A), transmitter 50 will also supply to a clock pulse to the CLK input of word sequencer 56. In response to this clock pulse word sequencer 56 provides an Attenuation load pulse which when supplied to the CLK input of an eight bit latch 170 loads the fourth data word of FIG. 3(A) into latch 170.

The eight bit data stored in latch 170 is supplied to programmable read only memory 172 and provides addressing for a look-up table stored in memory 172. Appendix B is a listing of the contents of the look-up table stored within memory 172. This look-up table provides an eight bit hexadecimal coded digital attenuation response for each eight bit address supplied to memory 172 within an attenuation range of 0 decibels/meters to minus 85 decibels/meter. The eight bit digital attenuation signal provided by memory 172 is supplied to a digital to analog converter 174 which converts the digital attenuation signal to an analog attenuation signal. This analog signal is next amplified by an amplifier 176 and then supplied to a current controlled attenuator 166. Simultaneously, the digital attenuation signal is supplied through an amplifier 178 to a ten decibel step attenuator 182. Current controlled attenuator 166, in turn, provides for one decibel step attenuation of the amplitude of the microwave signal generated by oscillator 120, while attenuator 182 provides for ten decibel step attenuation of the amplitude of the microwave signal generated by oscillator 120. It should be noted that the look-up table of Appendix B is set at one decibel step attenuations thus necessitating the use of a single decibel step attenuator and a ten decibel step attenuator. It should further be noted that the attenuators 166 and 182 are respectively Hewlett Packard Model HP8494G/H and HP 8496G/H attenuators although it should be understood that any well known, commercially available attenuators may be used as attenuators 166 and 182.

Pin diode modulator 122 amplitude modulates the microwave signal provided by oscillator 120 using either the 640 pulses per second signal or the 160 pulses per second signal provided by pulse repetition frequency generator circuit 21 as the modulating signal. Isolators 160, 164 and 168 respectively prevent reflection of the microwave signal back to oscillator 120, coupler 162, and attenuator 166. The microwave signal provided at the output of attenuator 182 is supplied through a terminal 184 to a boresight tower, not shown, to calibrate a radar system.

From the foregoing description, it may readily be seen that the present invention comprises a new, unique and exceedingly useful C band signal generator which constitutes a considerable improvement over the known prior art. Obviously, many modifications and variations of the present invention are possible in light of the above teachings. It is, therefore to be understood that within the scope of the appended claims the invention may be practiced otherwise than as specifically described.

APPENDIX A

| ADR. | HEX. DATA | FREQ. | BINARY EQUIV. |
|---|---|---|---|
| 000 | 000 | 5400 | 0 0 0 0 0 0 0 0 |
| 001 | 012 | 5405 | 0 0 0 1 0 0 0 0 |
| 002 | 016 | 5410 | 0 0 0 1 0 1 1 0 |
| 003 | 017 | 5415 | 0 0 0 1 0 1 1 1 |
| 004 | 019 | 5420 | 0 0 0 1 1 0 0 1 |
| 005 | 01A | 5425 | 0 0 0 1 1 0 1 0 |
| 006 | 01B | 5430 | 0 0 0 1 1 0 1 1 |
| 007 | 01C | 5435 | 0 0 0 1 1 1 0 0 |
| 008 | 01E | 5440 | 0 0 0 1 1 1 1 0 |
| 009 | 01F | 5445 | 0 0 0 1 1 1 1 1 |
| 010 | 020 | 5450 | 0 0 1 0 0 0 0 0 |
| 011 | 022 | 5455 | 0 0 1 0 0 0 1 0 |
| 012 | 023 | 5460 | 0 0 1 0 0 0 1 1 |
| 013 | 024 | 5465 | 0 0 1 0 0 1 0 0 |
| 014 | 026 | 5470 | 0 0 1 0 0 1 1 0 |
| 015 | 027 | 5475 | 0 0 1 0 0 1 1 1 |
| 016 | 028 | 5480 | 0 0 1 0 1 0 0 0 |
| 017 | 02A | 5485 | 0 0 1 0 1 0 1 0 |
| 018 | 02B | 5490 | 0 0 1 0 1 0 1 1 |
| 019 | 02D | 5495 | 0 0 1 0 1 1 0 1 |
| 020 | 02E | 5500 | 0 0 1 0 1 1 1 0 |
| 021 | 030 | 5505 | 0 0 1 1 0 0 0 0 |
| 022 | 031 | 5510 | 0 0 1 1 0 0 0 1 |
| 023 | 033 | 5515 | 0 0 1 1 0 0 1 1 |
| 024 | 034 | 5520 | 0 0 1 1 0 1 0 0 |
| 025 | 036 | 5525 | 0 0 1 1 0 1 1 0 |
| 026 | 037 | 5530 | 0 0 1 1 0 1 1 1 |
| 027 | 039 | 5535 | 0 0 1 1 1 0 0 1 |

APPENDIX A-continued

| ADR. | HEX. DATA | FREQ. | BINARY EQUIV. |
|---|---|---|---|
| 028 | 03B | 5540 | 0 0 1 1 1 0 1 1 |
| 029 | 03C | 5545 | 0 0 1 1 1 1 0 0 |
| 030 | 03E | 5550 | 0 0 1 1 1 1 1 0 |
| 031 | 040 | 5555 | 0 1 0 0 0 0 0 0 |
| 032 | 041 | 5560 | 0 1 0 0 0 0 0 1 |
| 033 | 043 | 5565 | 0 1 0 0 0 0 1 1 |
| 034 | 045 | 5570 | 0 1 0 0 0 1 0 1 |
| 035 | 047 | 5575 | 0 1 0 0 0 1 1 1 |
| 036 | 048 | 5580 | 0 1 0 0 1 0 0 0 |
| 037 | 04A | 5585 | 0 1 0 0 1 0 1 0 |
| 038 | 04C | 5590 | 0 1 0 0 1 1 0 0 |
| 039 | 04E | 5595 | 0 1 0 0 1 1 1 0 |
| 040 | 050 | 5600 | 0 1 0 1 0 0 0 0 |
| 041 | 052 | 5605 | 0 1 0 1 0 0 1 0 |
| 042 | 054 | 5610 | 0 1 0 1 0 1 0 0 |
| 043 | 056 | 5615 | 0 1 0 1 0 1 1 0 |
| 044 | 058 | 5620 | 0 1 0 1 1 0 0 0 |
| 045 | 05A | 5625 | 0 1 0 1 1 0 1 0 |
| 046 | 05C | 5630 | 0 1 0 1 1 1 0 0 |
| 047 | 05E | 5635 | 0 1 0 1 1 1 1 0 |
| 048 | 060 | 5640 | 0 1 1 0 0 0 0 0 |
| 049 | 061 | 5645 | 0 1 1 0 0 0 1 0 |
| 050 | 065 | 5650 | 0 1 1 0 0 1 0 1 |
| 051 | 067 | 5655 | 0 1 1 0 0 1 1 1 |
| 052 | 069 | 5660 | 0 1 1 0 1 0 0 1 |
| 053 | 06B | 5665 | 0 1 1 0 1 0 1 1 |
| 054 | 06E | 5670 | 0 1 1 0 1 1 1 0 |
| 055 | 070 | 5675 | 0 1 1 1 0 0 0 0 |
| 056 | 072 | 5680 | 0 1 1 1 0 0 1 0 |
| 057 | 074 | 5685 | 0 1 1 1 0 1 0 0 |
| 058 | 077 | 5690 | 0 1 1 1 0 1 1 1 |
| 059 | 079 | 5695 | 0 1 1 1 1 0 0 1 |
| 060 | 07B | 5700 | 0 1 1 1 1 0 1 1 |
| 061 | 07E | 5705 | 0 1 1 1 1 1 1 0 |
| 062 | 081 | 5710 | 1 0 0 0 0 0 0 1 |
| 063 | 083 | 5715 | 1 0 0 0 0 0 1 1 |
| 064 | 086 | 5720 | 1 0 0 0 0 1 1 0 |
| 065 | 088 | 5725 | 1 0 0 0 1 0 0 0 |
| 066 | 08B | 5730 | 1 0 0 0 1 0 1 1 |
| 067 | 08D | 5735 | 1 0 0 0 1 1 0 1 |
| 068 | 090 | 5740 | 1 0 0 1 0 0 0 0 |
| 069 | 093 | 5745 | 1 0 0 1 0 0 1 1 |
| 070 | 095 | 5750 | 1 0 0 1 0 1 0 1 |
| 071 | 098 | 5755 | 1 0 0 1 1 0 0 0 |
| 072 | 09B | 5760 | 1 0 0 1 1 0 1 1 |
| 073 | 09E | 5765 | 1 0 0 1 1 1 1 0 |
| 074 | 0A1 | 5770 | 1 0 1 0 0 0 0 1 |
| 075 | 0A4 | 5775 | 1 0 1 0 0 1 0 0 |
| 076 | 0A7 | 5780 | 1 0 1 0 0 1 1 1 |
| 077 | 0AA | 5785 | 1 0 1 0 1 0 1 0 |
| 078 | 0AC | 5790 | 1 0 1 0 1 1 0 0 |
| 079 | 0B0 | 5795 | 1 0 1 1 0 0 0 0 |
| 080 | 0B3 | 5800 | 1 0 1 1 0 0 1 1 |
| 081 | 0B6 | 5805 | 1 0 1 1 0 1 1 0 |
| 082 | 0B9 | 5810 | 1 0 1 1 1 0 0 1 |
| 083 | 0BD | 5815 | 1 0 1 1 1 1 0 1 |
| 084 | 0C0 | 5820 | 1 1 0 0 0 0 0 0 |
| 085 | 0C3 | 5825 | 1 1 0 0 0 0 1 1 |
| 086 | 0C7 | 5830 | 1 1 0 0 0 1 1 1 |
| 087 | 0CA | 5835 | 1 1 0 0 1 0 1 0 |
| 088 | 0CE | 5840 | 1 1 0 0 1 1 1 0 |
| 089 | 0D2 | 5845 | 1 1 0 1 0 0 1 0 |
| 090 | 0D6 | 5850 | 1 1 0 1 0 1 1 0 |
| 091 | 0D9 | 5855 | 1 1 0 1 1 0 0 1 |
| 092 | 0DE | 5860 | 1 1 0 1 1 1 1 0 |
| 093 | 0E1 | 5865 | 1 1 1 0 0 0 0 1 |
| 094 | 0E6 | 5870 | 1 1 1 0 0 1 1 0 |
| 095 | 0EA | 5875 | 1 1 1 0 1 0 1 0 |
| 096 | 0EF | 5880 | 1 1 1 0 1 1 1 1 |
| 097 | 0F3 | 5885 | 1 1 1 1 0 0 1 1 |
| 098 | 0F7 | 5890 | 1 1 1 1 0 1 1 1 |
| 099 | 0FF | 5895 | 1 1 1 1 1 1 1 1 |

APPENDIX B

| DB/M | ADR. | HEX. DATA | BINARY EQUIV. |
|---|---|---|---|
| 0 | 00 | 00 | 0 0 0 0 0 0 0 0 |
| 1 | 01 | 05 | 0 0 0 0 0 1 0 1 |
| 2 | 02 | 07 | 0 0 0 0 0 1 1 1 |

APPENDIX B-continued

| DB/M | ADR. | HEX. DATA | BINARY EQUIV. |
|---|---|---|---|
| 3 | 03 | 09 | 0 0 0 0 1 0 0 1 |
| 4 | 04 | 0B | 0 0 0 0 1 0 1 1 |
| 5 | 05 | 0D | 0 0 0 0 1 1 0 1 |
| 6 | 06 | 0F | 0 0 0 0 1 1 1 1 |
| 7 | 07 | 11 | 0 0 0 1 0 0 0 1 |
| 8 | 08 | 14 | 0 0 0 1 0 1 0 0 |
| 9 | 09 | 16 | 0 0 0 1 0 1 1 0 |
| 10 | 10 | 20 | 0 0 1 0 0 0 0 0 |
| 11 | 11 | 25 | 0 0 1 0 0 1 0 1 |
| 12 | 12 | 27 | 0 0 1 0 0 1 1 1 |
| 13 | 13 | 29 | 0 0 1 0 1 0 0 1 |
| 14 | 14 | 2B | 0 0 1 0 1 0 1 1 |
| 15 | 15 | 2D | 0 0 1 0 1 1 0 1 |
| 16 | 16 | 2F | 0 0 1 0 1 1 1 1 |
| 17 | 17 | 31 | 0 0 1 1 0 0 0 1 |
| 18 | 18 | 34 | 0 0 1 1 0 1 0 0 |
| 19 | 19 | 36 | 0 0 1 1 0 1 1 0 |
| 20 | 20 | 40 | 0 1 0 0 0 0 0 0 |
| 21 | 21 | 45 | 0 1 0 0 0 1 0 1 |
| 22 | 22 | 47 | 0 1 0 0 0 1 1 1 |
| 23 | 23 | 49 | 0 1 0 0 1 0 0 1 |
| 24 | 24 | 4B | 0 1 0 0 1 0 1 1 |
| 25 | 25 | 4D | 0 1 0 0 1 1 0 1 |
| 26 | 26 | 4F | 0 1 0 0 1 1 1 1 |
| 27 | 27 | 51 | 0 1 0 1 0 0 0 1 |
| 28 | 28 | 54 | 0 1 0 1 0 1 0 0 |
| 29 | 29 | 57 | 0 1 0 1 0 1 1 1 |
| 30 | 30 | 60 | 0 1 1 0 0 0 0 0 |
| 31 | 31 | 65 | 0 1 1 0 0 1 0 1 |
| 32 | 32 | 67 | 0 1 1 0 0 1 1 1 |
| 33 | 33 | 69 | 0 1 1 0 1 0 0 1 |
| 34 | 34 | 6B | 0 1 1 0 1 0 1 1 |
| 35 | 35 | 6D | 0 1 1 0 1 1 0 1 |
| 36 | 36 | 6F | 0 1 1 0 1 1 1 1 |
| 37 | 37 | 71 | 0 1 1 1 0 0 0 1 |
| 38 | 38 | 74 | 0 1 1 1 0 1 0 0 |
| 39 | 39 | 76 | 0 1 1 1 0 1 1 0 |
| 40 | 40 | 80 | 1 0 0 0 0 0 0 0 |
| 41 | 41 | 85 | 1 0 0 0 0 1 0 1 |
| 42 | 42 | 87 | 1 0 0 0 0 1 1 1 |
| 43 | 43 | 89 | 1 0 0 0 1 0 0 1 |
| 44 | 44 | 8B | 1 0 0 0 1 0 1 1 |
| 45 | 45 | 8D | 1 0 0 0 1 1 0 1 |
| 46 | 46 | 8F | 1 0 0 0 1 1 1 1 |
| 47 | 47 | 91 | 1 0 0 1 0 0 0 1 |
| 48 | 48 | 94 | 1 0 0 1 0 1 0 0 |
| 49 | 49 | 96 | 1 0 0 1 0 1 1 0 |
| 50 | 50 | A0 | 1 0 1 0 0 0 0 0 |
| 51 | 51 | A5 | 1 0 1 0 0 1 0 1 |
| 52 | 52 | A7 | 1 0 1 0 0 1 1 1 |
| 53 | 53 | A9 | 1 0 1 0 1 0 0 1 |
| 54 | 54 | AB | 1 0 1 0 1 0 1 1 |
| 55 | 55 | AD | 1 0 1 0 1 1 0 1 |
| 56 | 56 | AF | 1 0 1 0 1 1 1 1 |
| 57 | 57 | B1 | 1 0 1 1 0 0 0 1 |
| 58 | 58 | B4 | 1 0 1 1 0 1 0 0 |
| 59 | 59 | B6 | 1 0 1 1 0 1 1 0 |
| 60 | 60 | C0 | 1 1 0 0 0 0 0 0 |
| 61 | 61 | C4 | 1 1 0 0 0 1 0 0 |
| 62 | 62 | C7 | 1 1 0 0 0 1 1 1 |
| 63 | 63 | C9 | 1 1 0 0 1 0 0 1 |
| 64 | 64 | CB | 1 1 0 0 1 0 1 1 |
| 65 | 65 | CD | 1 1 0 0 1 1 0 1 |
| 66 | 66 | CF | 1 1 0 0 1 1 1 1 |
| 67 | 67 | D1 | 1 1 0 1 0 0 0 1 |
| 68 | 68 | D4 | 1 1 0 1 0 1 0 0 |
| 69 | 69 | D6 | 1 1 0 1 0 1 1 0 |
| 70 | 70 | E0 | 1 1 1 0 0 0 0 0 |
| 71 | 71 | E4 | 1 1 1 0 0 1 0 0 |
| 72 | 72 | E7 | 1 1 1 0 0 1 1 1 |
| 73 | 73 | E9 | 1 1 1 0 1 0 0 1 |
| 74 | 74 | EB | 1 1 1 0 1 0 1 1 |
| 75 | 75 | ED | 1 1 1 0 1 1 0 1 |
| 76 | 76 | EF | 1 1 1 0 1 1 1 1 |
| 77 | 77 | F1 | 1 1 1 1 0 0 0 1 |
| 78 | 78 | F4 | 1 1 1 1 0 1 0 0 |
| 79 | 79 | F6 | 1 1 1 1 0 1 1 0 |
| 80 | 80 | FC | 1 1 1 1 1 1 0 0 |
| 81 | 81 | FF | 1 1 1 1 1 1 1 1 |
| 82 | 82 | FF | |
| 83 | 83 | FF | |

APPENDIX B-continued

| DB/M | ADR. | HEX. DATA | BINARY EQUIV. |
|---|---|---|---|
| 84 | 84 | FF | |
| 85 | 85 | FF | |
| 86 | 86 | FF | |
| 87 | 87 | FF | |
| 88 | 88 | FF | |
| 89 | 89 | FF | |
| 90 | 90 | FF | |
| 91 | 91 | FF | |
| 92 | 92 | FF | |
| 93 | 93 | FF | |
| 94 | 94 | FF | |
| 95 | 95 | FF | |
| 96 | 96 | FF | |
| 97 | 97 | FF | |
| 98 | 98 | FF | |
| 99 | 99 | FF | |

What is claimed is:

1. A C-band signal generator for producing in response to a serial digital data stream of at least six eight bit words a microwave signal having a frequency within the range of approximately five thousand four hundred to approximately five thousand nine hundred megahertz:

first circuit means for receiving said serial digital data stream, for converting each serial digital data word of said serial digital data stream into a parallel eight bit digital data word and for providing a first reference signal having a predetermined frequency;

pulse generating means for receiving the fifth of said parallel eight bit digital data words;

said pulse generating means providing in response to said fifth data word a pulsed modulating signal having a first predetermined frequency or a second predetermined frequency and a first pulse width or a second pulse width;

second circuit means for receiving the fourth of said eight bit parallel data words and for providing in response to said fourth data word a digital attenuation signal and an analog attenuation signal;

first phase lock circuit means for receiving said first reference signal and the second and third of said eight bit parallel data words and for generating in response to said first reference signal and said second and third data words a first direct current voltage;

first voltage controlled oscillator means for generating in response to said first direct current voltage a second reference signal within a predetermined frequency range;

said second reference signal being synchronized in phase with said first reference signal and said second reference signal being representative of the frequency of the microwave signal to be produced by said C-band signal generator;

second voltage controlled oscillator means for generating the microwave signal to be provided by said C-band signal generator;

third circuit means for sampling the microwave signal generated by said second voltage controlled oscillator means, for receiving said second reference signal and for providing in response to said sampled microwave signal and said second reference signal an error signal;

second phase lock loop circuit means for the sixth of said eight bit parallel data words and said error signal and for providing in response to said sixth data word a second direct current voltage;

said sixth data word providing the frequency of the microwave signal to be produced by said C-band signal generator;

said second direct current voltage being supplied to said second voltage tunable oscillator means so as to stabilize the microwave signal being generated by said second direct current voltage means to the frequency of said sixth parallel data word;

first attenuator means for receiving said analog attenuation signal and said stabilized microwave signal and for providing one decibel step attenuation of the amplitude of said stabilized microwave signal in response to said analog attenuation signal;

pin diode modulator means for receiving said pulsed modulating signal and said stabilized microwave signal and for amplitude modulating said stabilized microwave signal; and second attenuator means for receiving said digital attenuation signal and said stabilized microwave signal and for providing ten decibel step attenuation of the amplitude of said stabilized microwave signal in response to said digital attenuation signal.

2. The C-band signal generator of claim 1 wherein the first predetermined frequency of said pulsed modulating signal is six hundred and forty pulses per second and the second predetermined frequency of said pulsed modulating signal is one hundred sixty pulses per second.

3. The C-band signal generator of claim 1 wherein the band width of said pulsed modulating signal is either one microsecond or one half microsecond.

4. The C-band signal generator of claim 1 wherein said third circuit means comprises:

a directional coupler having an input for receiving and sampling said microwave signal and an output;

a mixer having a first input connected to the output of said directional coupler, and a second input for receiving said second reference signal;

said mixer combining said sampled microwave signal and said second reference signal; and a discriminator for receiving said combined sampled microwave signal and said second reference signal and for providing in response to said combined signals said error signal.

5. The C-band signal generator of claim 1 wherein the frequency of said first reference signal is approximately 22.73 kilohertz.

6. The C-band signal generator of claim 1 wherein the frequency range of said second reference signal is between 245 and 268 kilohertz.

7. The C-band signal generator of claim 1 wherein the first of said eight bit parallel data words is decoded by said first circuit means to provide a synch pulse to reset said C-band signal generator so as to allow another serial digital data stream to be provided to said C-band signal generator such that said C-band signal generator will provide a second microwave signal within the range of approximately five thousand four hundred to approximately five thousand nine hundred megahertz.

8. A C-band signal generator comprising:

a data receiver circuit having a serial data input, a first parallel data output, a second parallel data output and a clock output;

a pulse repetition frequency generator circuit having an external modulation trigger input, an external clock input, a parallel data input, a load data input and an output;

a first data bus connected between the first parallel data output of said data receiver circuit and the parallel data input of said pulse repetition frequency generating circuit;

a second data bus connected between the second parallel data output of said data receiver circuit and the load data input of said pulse repetition frequency generating circuit;

an attenuation driver circuit having a parallel data input connected to said first data bus, a load data input connected to said second data bus, and an analog signal output and a digital signal output;

a very high frequency synthesizer circuit having a parallel data input connected to said first data bus, a load data input connected to said second data bus, a first clock input connected to the clock output of said data receiver circuit, a second clock input and an output;

a voltage controlled oscillator having an input connected to the output of said very high frequency synthesizer circuit and an output;

a divide by one hundred prescaler having an input connected to the output of said voltage controlled oscillator and an output connected to the second clock input of said very high frequency synthesizer circuit;

a voltage tunable oscillator pretune circuit having a parallel data input connected to said first data bus, a load data input connected to said second data bus, an error signal input and an output;

an amplitude and frequency multiplier having an input connected to the output of said voltage controlled oscillator and an output;

a mixer having a first input connected to the output of said amplitude and frequency multiplier, a second input and an output;

a discriminator having an input connected to the output of said mixer and an output connected to the error signal input of said voltage controlled oscillator;

a voltage tunable oscillator having an input connected to the output of said voltage tunable oscillator pretune circuit and an output;

a directional coupler having an input connected to the output of said voltage tunable oscillator, a first output connected to the second input of said mixer and an output;

a current controlled attenuator having a first input connected to the output of said directional coupler, a second input connected to the analog signal output of said attenuation driver circuit and an output;

a pin diode modulator having a first input connected to the output of said current controlled attenuator, a second input connected to the output of said pulse repetition frequency generator circuit and an output; and a step attenuator having a first input connected to the output of said pin diode modulator, a second input connected to the digital signal output of said attenuation driver and an output.

9. The C-band signal generator of claim 8 wherein said first data bus comprises an eight bit parallel data bus.

10. The C-band signal generator of claim 8 wherein said second data bus comprises a five bit parallel data bus.

11. The C-band signal generator of claim 8 further comprising a first isolator connected between said voltage tunable oscillator and said directional coupler, a second isolator connected between said directional coupler and said current controlled attenuator and a third isolator connected between said current controlled attenuator and said pin diode modulator.

12. The C-band signal generator of claim 8 wherein said attenuation driver circuit comprises:
   an eight bit latch having eight data inputs connected to said first data bus, a load data input connected to said second data bus and eight data outputs;
   a programmable read only memory having eight data inputs and eight data outputs, each data input of said memory being connected to only one of the data outputs of said eight bit latch;
   a digital to analog converter having five data inputs and an output, each data input of said digital to analog converter being connected to only one of the data outputs of said programmable read only memory;
   an analog amplifier having an input connected to the output of said digital to analog converter and an output connected to the second input of said current controlled attenuator; and
   a digital amplifier having three data inputs and an output connected to the second input of said step attenuator, each data input of said digital amplifier being connected to only one of the data outputs of said programmable read only memory.

13. The C-band signal generator of claim 8 wherein said very high frequency synthesizer circuit comprises:
   a first eight bit latch having eight data inputs connected to said first data bus, a load data input connected to said second data bus and eight data outputs;
   a second eight bit latch having eight data inputs connected to said first data bus, a load data input connected to said second data bus and four data outputs;
   a programmable divide by N counter having twelve data inputs a clock input and an output, each data input of said counter being connected to only one of the data outputs of said first or second eight bit latches;
   a D Flip-Flop having a clock input connected to the output of divide by one hundred prescaler and an output connected to the clock input of said programmable divide by N counter;
   a phase detector having a first input connected to the output of said programmable divide by N counter, a second input and an output;
   a divide by one hundred circuit having an input connected to the clock output of said data receiver circuit and an output connected to the clock input of said programmable divide by N counter; and
   a low pass filter having an input connected to the output of said phase detector and an output connected to the input of said input of said voltage controlled oscillator.

14. The C band signal generator of claim 8 wherein said voltage tunable oscillator pretune circuit comprises:
   an eight bit latch having eight data inputs connected to said first data bus, a load data input connected to said second data bus and eight data outputs;
   a programmable read only memory having eight data inputs and eight data outputs, each data input of said memory being connected to only one of the data outputs o said eight bit latch;
   a digital to analog converter having eight data inputs and an output, each data input of said digital to analog converter being connected to only one of the data outputs of said programmable read only memory;
   an operational amplifier having an input connected to the output of said digital to analog converter and an output;
   a summing amplifier having a negative input connected to the output of said operational amplifier, a positive input and an output connected to the input of said voltage tunable oscillator; and
   a driver circuit having an input connected to the output of said discriminator and an output connected to the negative input of said summing amplifier.

15. The C-band signal generator of claim 8 wherein said data receiver circuit comprises:
   a modem having a serial data input, an oscillator input and a serial data output;
   a universal asynchronous receiver transmitter having a serial data input connected to the serial data output of said modem, eight data outputs connected to said first data bus, a clock input, a data received reset input and a data received output;
   an oscillator having an output connected to the lock input of said universal asynchronous receiver transmitter and the oscillator input of said modem;
   a timing divider circuit having a clock input connected to the output of said oscillator, a first output connected to the clock input of said universal asynchronous receiver transmitter and a second output;
   a divide by eleven circuit having an input connected to the second output of said timing divider circuit and an output connected to the first clock input of said data receiver circuit;
   an eight bit latch having eight data inputs connected to said first data bus, a load data input connected to the data received output of said universal asynchronous receiver transmitter and four data outputs;
   a first NAND gate having four inputs and an output, each input of said AND gate being connected to only one of the data outputs of said eight bit latch;
   a second AND gate having four data inputs connected to the output of said first AND gate and an output;
   a pulse code modulated word sequencer having a reset input connected to the output of said second AND gate, a load data input connected to the data received output of said universal asynchronous receiver transmitter and six data outputs connected to said second data bus;
   an operational amplifier having an input connected to the data received output of said universal asynchronous receiver transmitter, and an output;
   a first NAND gate having a pair of inputs connected to the output of said operational amplifier and an output; and
   a second NAND gate having a pair of inputs connected to the output of said first NAND gate and an output connected to the data received reset input of said universal asynchronous receiver transmitter.

16. The C-band signal generator of claim 8 wherein said pulse repetition frequency generator circuit comprises:

a first EXCLUSIVE OR circuit having an external clock input and an output;

a second EXCLUSIVE OR circuit having a first input connected to the output of said first EXCLUSIVE OR circuit, a second input and an output;

an oscillator having an input connected to the output of said second EXCLUSIVE OR circuit and an output;

a divide by ten circuit having an input connected to the output of said oscillator and an output connected to the second input of said EXCLUSIVE OR circuit;

a twelve stage binary ripple counter having a clock input connected to the output of said divide by ten circuit and first and second outputs;

an eight bit latch having eight data inputs connected to said first data bus, a load data input connected to said second data bus and eight data outputs;

a first AND gate having a first input connected to the first data output of said latch, a second input connected to the first output of said binary ripple counter and an output;

a first inverter having an input connected to the first output of said latch and an output;

a second AND gate having a first input connected to the output of said first inverter, a second input connected to the second output of said binary ripple counter and an output;

a first NOR gate having a first input connected to the output of said first AND gate, a second input connected to the output of said second AND gate and an output;

a first one shot multivibrator having an input connected to the output of said first NOR gate and an output;

a second one shot multivibrator having an input connected to the output of said first NOR gate and an output;

a first NAND gate having a first input connected to the output of said first one shot multivibrator, a second input connected to the second data output of said latch and an output;

a second inverter having an input connected to the second data output of said latch and an output;

a second NAND gate having a first input connected to the output of said second inverter, a second input connected to the output of one shot multivibrator and an output;

a third NAND gate having a first input connected to the output of said first NAND gate, a second input connected to the output of said second NAND gate, and an output;

a fourth NAND gate having a first input connected to the output of said third NAND gate, a second input connected to the third data output of said latch, and an output;

a third inverter having an input connected to the output of said fourth NAND gate and an output;

a second NOR gate having an external modulation input, an internal PRF input connected to the output of said third inverter and an output;

a fifth NAND gate having a first input connected to the output of said second NOR gate, a second input connected to the fourth data output of said latch, and an output;

a fourth inverter having an input connected to the output of said fifth NAND gate and an output;

a diode having a cathode connected to the output of said second NOR gate and an anode;

a capacitor connected between ground and the anode of said diode;

a resistor connected between plus five volts and the anode of said diode;

a fifth inverter having an input connected to the anode of said diode and an output;

a third AND gate having a first input connected to the output of said fifth inverter, a second input connected to the fifth data output of said latch, and an output;

a sixth inverter having an input connected to the output of said third AND gate and an output; and a third NOR gate having a first input connected to the output of said sixth inverter, a second input connected to the output of said inverter and an output connected to the second input of said pin diode modulator.

17. The C-band signal generator of claim 8 wherein said pulse repetition frequency generator circuit generates a modulating signal having a pulse repetition frequency of six hundred and forty pulses per second or one hundred and sixty pulses per second and a pulse width of one microsecond or one half microsecond.

* * * * *